United States Patent
Jang et al.

(10) Patent No.: US 8,339,604 B2
(45) Date of Patent: Dec. 25, 2012

(54) SUBSTRATE INCLUDING ALIGNMENT MARKS, METHODS OF ALIGNING WAFERS AND FABRICATING SEMICONDUCTORS

(75) Inventors: Jun-Young Jang, Suwon-si (KR); Ji-Yong You, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 387 days.

(21) Appl. No.: 12/656,812

(22) Filed: Feb. 17, 2010

(65) Prior Publication Data
US 2010/0245825 A1 Sep. 30, 2010

(30) Foreign Application Priority Data
Mar. 27, 2009 (KR) .................. 10-2009-0026421

(51) Int. Cl.
*G01B 11/00* (2006.01)
(52) U.S. Cl. ......... 356/401; 356/620; 356/614; 257/797
(58) Field of Classification Search .......... 356/399–401, 356/614, 620; 257/797
See application file for complete search history.

(56) References Cited

U.S. PATENT DOCUMENTS

| 6,778,275 | B2* | 8/2004 | Bowes ..................... 356/400 |
| 7,633,618 | B2* | 12/2009 | Monshouwer ............ 356/401 |
| 8,111,398 | B2* | 2/2012 | Van Der Schaar et al. ... 356/399 |
| 2008/0106738 | A1* | 5/2008 | Kim ........................ 356/399 |

FOREIGN PATENT DOCUMENTS

| JP | 2006-165377 | 6/2006 |
| KR | 10-2001-0046171 | 6/2001 |
| KR | 10-2006-0110893 | 10/2006 |

* cited by examiner

*Primary Examiner* — Layla Lauchman
(74) *Attorney, Agent, or Firm* — Harness, Dickey & Pierce, P.L.C.

(57) ABSTRACT

Provided is a substrate having an alignment mark, methods of aligning wafers and fabricating semiconductors. An alignment method of a wafer comprises providing a wafer on a wafer stage of a photolithography apparatus, irradiating light to the alignment mark, collecting reflected light from the alignment mark, analyzing optical information of the collected light, and determining a location of the wafer based on the analyzed optical information, wherein the wafer comprises a first surface having an alignment mark, the alignment mark including a first plurality of alignment patterns in a first row, and a second plurality of alignment patterns in a second row, the second plurality of alignment patterns being adjacent to the first plurality of alignment patterns, wherein the first plurality of alignment patterns are arranged in a row direction at a first pitch, and the second plurality of alignment patterns are arranged in the row direction at a second pitch different from the first pitch.

19 Claims, 12 Drawing Sheets

(a)

(b)

(a)

(b)

(a)

(b)

(a)

(b)

(a)

(b)

(a)

(b)

SUBSTRATE INCLUDING ALIGNMENT MARKS, METHODS OF ALIGNING WAFERS AND FABRICATING SEMICONDUCTORS

CROSS-REFERENCE TO RELATED APPLICATIONS

This application claims the benefit of priority under 35 U.S.C. §119 to Korean Patent Application No. 10-2009-0026421, filed on Mar. 27, 2009, in the Korean Intellectual Property Office (KIPO), the contents of which are hereby incorporated herein by reference in their entirety.

BACKGROUND

1. Field

Example embodiments of inventive concepts relate to alignment marks, methods of aligning semiconductor wafers, and methods of fabricating semiconductors.

2. Description of Related Art

With downscaling of patterns formed on semiconductor devices, more attention is paid to photolithography processes. A photolithography process may depend not only on a technique of forming fine patterns but also a technique of precisely aligning a photomask with a wafer. During the photolithography process, a photolithography apparatus may irradiate light to the photomask and alignment marks of a wafer and sense, analyze, and compare reflected and diffracted light, thereby enabling precise alignment of the photomask with the wafer.

SUMMARY

Example embodiments of inventive concepts provide alignment marks that may be used by a scanner of a photolithography apparatus.

Example embodiments of inventive concepts also provide methods of performing an alignment process using alignment marks.

Example embodiments of inventive concepts also provide methods of fabricating a semiconductor device using alignment marks.

Example embodiments of inventive concepts are not limited by the above-described objects, and other undescribed embodiments will be clearly understood by those skilled in the art with reference to example embodiments of inventive concepts set forth herein.

In accordance with example embodiments of inventive concepts, a substrate may include a first surface having an alignment mark wherein the alignment mark includes a first plurality of alignment patterns in a first row; and a second plurality of alignment patterns in a second row. In accordance with example embodiments of inventive concepts, the second plurality of alignment patterns may be adjacent to the first plurality of alignment patterns. The first plurality of alignment patterns may be arranged in a row direction at a first pitch, and the second plurality of alignment patterns may be arranged in the row direction at a second pitch that is different from the first pitch.

According to example embodiments of inventive concepts, an alignment mark used in a photolithography process may include a first row including a plurality of alignment patterns and a second row disposed adjacent to the first row.

According to example embodiments of inventive concepts, an alignment mark used in a photolithography process may include a first row and a second row having a plurality of alignment patterns, respectively, wherein the second row is adjacent to the first row, and the alignment patterns in the first row are arranged in a first pitch, and the alignment patterns in the second row are arranged in a second pitch different from the first pitch, and wherein the first row is a real row having alignment information of the wafer, and the second row is a dummy row not having alignment information of the wafer.

According to example embodiments of inventive concepts, an alignment method of a wafer used in a photolithography apparatus may include locating the wafer having an alignment mark on a wafer stage of the photolithography apparatus, irradiating light to the alignment mark, collecting reflected light from the alignment mark, analyzing optical information of the collected light, and determining an accurate location of the wafer, wherein the alignment mark comprises a first row including a plurality of alignment patterns and a second row disposed adjacent to the first row, wherein the alignment patterns included in the first row are arranged in a row direction at a first pitch, and alignment patterns included in the second row are arranged in the row direction at a second pitch different from the first pitch.

According to example embodiments of inventive concepts, an alignment method of a wafer used in a photolithography apparatus may comprise locating the wafer having an alignment mark on a wafer stage of the photolithography apparatus, irradiating light to the alignment mark, collecting reflected light from the alignment mark, analyzing optical information of the collected light, and determining an accurate location of the wafer, wherein the alignment mark comprises a first row and a second row having a plurality of alignment patterns, respectively, wherein the second row is adjacent to the first row, and the alignment patterns in the first row are arranged in a first pitch, and the alignment patterns in the second row are arranged in a second pitch different from the first pitch, and wherein the first row is a real row having alignment information of the wafer, and wherein the second row is a dummy row not having alignment information of the wafer.

According to example embodiments of inventive concepts, a method of fabricating a semiconductor device may comprise loading a wafer having an alignment mark onto a wafer stage of a photolithography apparatus, irradiating light to the alignment mark through an irradiation slit of the photolithography apparatus, collecting reflected light from the alignment mark, analyzing optical information of the collected light, determining an accurate location of the wafer, moving the wafer to the determined location, and irradiating UV light from the light source of the photolithography apparatus to the wafer, wherein the alignment mark comprises, a first row including a plurality of alignment patterns and a second row disposed adjacent to the first row, wherein the alignment patterns included in the first row are arranged in a row direction at a first pitch, and alignment patterns included in the second row are arranged in the row direction at a second pitch different from the first pitch.

BRIEF DESCRIPTION OF THE DRAWINGS

Example embodiments of inventive concepts are described in further detail below with reference to the accompanying drawings. It should be understood that various aspects of the drawings may have been exaggerated for clarity.

DETAILED DESCRIPTION OF EXAMPLE EMBODIMENTS OF INVENTIVE CONCEPTS

Figure 1:
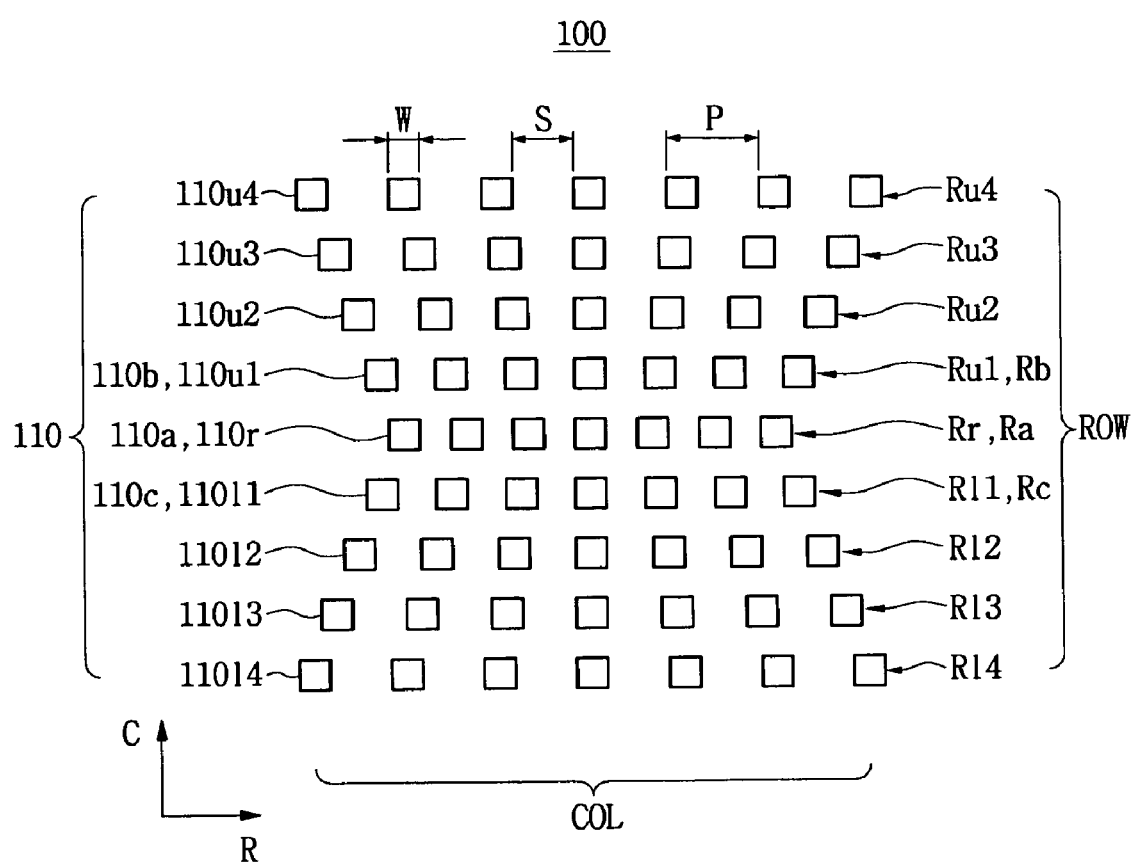
FIG. 1 is a plan view of an alignment mark according to example embodiments of inventive concepts.

Example embodiments of inventive concepts will now be described more fully with reference to the accompanying drawings, in which example embodiments of inventive concepts are shown. The invention may, however, be embodied in different forms and should not be construed as limited to the embodiments set forth herein. Rather, example embodiments of inventive concepts are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts. Example embodiments of inventive concepts will now be described more fully with reference to the accompanying drawings in which example embodiments of inventive concepts are shown. The inventive concepts may, however, be embodied in different forms and should not be construed as limited to example embodiments of inventive concepts set forth herein. Rather, example embodiments of inventive concepts are provided so that this disclosure is thorough and complete and fully conveys the scope of the inventive concepts to one skilled in the art. In the drawings, the thicknesses of layers and regions may be exaggerated for clarity. Like numbers refer to like elements throughout.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

In the present specification, an alignment mark is illustrated from the plan view. The alignment mark may be formed in a direction in which light is irradiated to a wafer in a photolithography apparatus called a scanner. For example, an illumination slit of the scanner may move downward from above or upward from below and move from left to right or from right to left. In the present specification, it is assumed that the illumination slit of the scanner moves upward from below. The alignment mark may be formed on the wafer using a photomask. An alignment mark according to example embodiments of inventive concepts may reflect and diffract light irradiated through an illumination slit of a scanner to a specific position and generate information on alignment of a photomask with a wafer.

FIG. 1 is a plan view of an alignment mark 100 according to example embodiments of inventive concepts.

Referring to FIG. 1, the alignment mark 100 according to example embodiments of inventive concepts may include a plurality of alignment patterns 110 arranged in a plurality of rows ROW and a plurality of columns COL. The alignment patterns 110 included in any one of the rows may be arranged in a row direction R at a constant pitch P, and two adjacent rows may include alignment patterns 110 arranged at different pitches P. For example, alignment patterns 110a included in a first row Ra may be arranged at a first pitch, while alignment patterns 110b included in a second row Rb disposed adjacent to the first row Ra may be arranged at a second pitch. The first pitch may be different from the second pitch. Each of the first and second rows Ra and Rb may refer to an arbitrary row. A row direction R may be a widthwise direction, while a column direction C may be a lengthwise direction. In a row, a distance between the corresponding portions of adjacent alignment patterns 110 may be referred to as a pitch P, an interval between the alignment patterns 110 may be referred to as a space S, and the length of the alignment patterns 110 measured in one direction may be referred to as a width W.

The alignment mark 100 may include at least one real row and at least two dummy rows. The real row may be used to obtain alignment information required for aligning a wafer, while the dummy rows may not be used to obtain the alignment information. The dummy rows may be used to obtain information on the position of the alignment mark 100 or the position of the real row. The alignment patterns 110 included in the real row may be referred to as real alignment patterns, while the alignment patterns 110 included in the dummy rows may be referred to as dummy alignment patterns. For example, assuming that the first row Ra is a real row, the alignment patterns 110a included in the first row Ra may be real alignment patterns. Assuming that the second row Rb is a dummy row, the alignment patterns 110b included in the second row 110b may be dummy alignment patterns. It is described that each of the alignment patterns 110 has a rectangular shape. In particular, each of the alignment patterns 110 may have a mesa or trench shape. Although each of the alignment patterns 110 does not need to have a rectangular shape, it is assumed in the present specification that each of the alignment patterns 110 has a rectangular shape because the rectangular shape is most convenient for an alignment process.

Referring again to FIG. 1, the alignment mark 100 may include only one real row Rr arranged in the center of the alignment mark 100, a plurality of upper dummy rows Ru1, Ru2, Ru3, and Ru4 arranged above the real row Rr, and a plurality of lower dummy rows Rl1, Rl2, Rl3, and Rl4 arranged below the real row Rr. The pitch between the dummy alignment patterns 110u1, 110u2, 110u3, 110u4 in the upper dummy rows Ru1, Ru2, Ru2, and Ru4 may decrease toward the real row Rr and increase away from the real row Rr. The pitch between the dummy alignment patterns 110l1, 110l2, 110l3, and 110l4 in the lower dummy rows Rl1, Rl2, Rl3, and Rl4 may decrease toward the real row Rr and increase away from the real row Rr. FIG. 1 illustrates a linear variation in the difference between pitches. In example embodiments of inventive concepts, even if the alignment patterns 110 are physically damaged due to a chemical mechanical polishing (CMP) process, the real alignment patterns 110r may not be damaged because the real alignment patterns 110r are formed in the center of the alignment mark 100.

Specifically, the real row Rr may be disposed in the very center of the alignment mark 100. Thereafter, a first upper dummy row Ru1 may be disposed above the real row Rr. A second upper dummy row Ru2 may be disposed above the first upper dummy row Ru1. A third upper dummy row Ru3 may be disposed above the second upper dummy row Ru2. A fourth upper dummy row Ru4 may be disposed above the third upper dummy row Ru3. Also, a first lower dummy row Rl1 may be disposed below the real row Rr. A second lower dummy row Rl2 may be disposed below the first lower dummy row Rl1. A third lower dummy row Rl3 may be disposed below the second lower dummy row Rl2. A fourth lower dummy row Rl4 may be disposed below the third lower dummy row Rl3. As shown in FIG. 1, the real row Rr, the upper dummy rows Ru1, Ru2, Ru3, and Ru4, and the lower dummy rows Rl1, Rl2, Rl3, and Rl4 may include the same number of unit alignment patterns 110. The real row Rr, the upper dummy rows Ru1, Ru2, Ru3, and Ru4 and the lower dummy rows Rl1, Rl2, Rl3, and Rl4 may be arranged at a constant interval.

A pitch between the real alignment patterns 110r included in the real row Rr may be controlled to be the smallest. A pitch between the first upper dummy alignment patterns 110u1 included in the first upper dummy row Ru1 may be controlled to be greater than the pitch between the real alignment patterns 110r. A pitch between the second upper dummy alignment patterns 110u2 included in the second upper dummy row Ru2 may be controlled to be greater than the pitch between the first upper dummy patterns 110u1. A pitch between the third upper dummy alignment patterns 110u3 included in the third upper dummy row Ru3 may be controlled to be greater than the pitch between the second upper dummy alignment patterns 110u2. A pitch between the fourth upper dummy alignment patterns 110u4 included in the fourth upper dummy row Ru4 may be controlled to be greater than the pitch between the third upper dummy alignment patterns 110u3. In other words, the pitch between the upper dummy alignment patterns 110u1, 110u2, 110u3, and 110u4 included in the upper dummy rows Ru1, Ru2, Ru3, and Ru4 arranged above the real row Rr may gradually increase away from the real row Rr. A greater number of upper dummy rows than described above may be disposed above the fourth upper dummy row Ru4.

Also, a pitch between the first lower dummy alignment patterns 110l1 included in the first lower dummy row Rl1 may be controlled to be greater than the pitch between the real alignment patterns 110r. A pitch between the second lower dummy alignment patterns 110l2 included in the second lower dummy row Rl2 may be controlled to be greater than the pitch between the first lower dummy alignment patterns 110l1. A pitch between the third lower dummy alignment patterns 110l3 included in the third lower dummy row Rl3 may be controlled to be greater than the pitch between the second lower dummy alignment patterns 110l2. A pitch between the fourth lower dummy alignment patterns 110l4 included in the fourth lower dummy row Rl4 may be controlled to be greater than the pitch between the third lower dummy alignment patterns 110l3. In other words, the pitch between the lower dummy alignment patterns 110l1, 110l2, 110l3, and 110l4 included in the lower dummy rows Rl1, Rl2, Rl3, Rl4 arranged below the real row Rr may gradually increase away from the real row Rr. As shown in FIG. 1, the pitch between the first upper dummy alignment patterns 110u1 may be controlled to be equal to the pitch between the first lower dummy alignment patterns 110l2. The pitch between the second upper dummy alignment patterns 110u2 may be controlled to be equal to the pitch between the second lower dummy alignment patterns 110l2. The pitch between the third upper dummy alignment patterns 110u3 may be controlled to be equal to the pitch between the third lower dummy alignment patterns 110l3. The pitch between the fourth upper dummy alignment patterns 110u4 may be controlled to be equal to the pitch between the fourth lower dummy alignment patterns 110l4.

The third upper and lower dummy rows Ru3 and Rl3 and the fourth upper and lower dummy rows Ru4 and Rl4 may not be formed. Conversely, fifth upper and lower dummy rows may be further formed.

During an actual alignment process, optical signals transmitted by the dummy rows Ru1, Ru2, Ru3, Ru4, Rl1, Rl2, Rl3, and Rl4 may not be sensed or may be sensed but neglected. Although the optical signals transmitted by the dummy rows Ru1, Ru2, Ru3, Ru4, Rl1, Rl2, Rl3, and Rl4 may be neglected, when the optical signals are sensed, the optical signals may be utilized as information to search for positional information on the alignment mark 100 and the real row Rr. For example, while no signals related to the alignment mark 100 are transmitted, when the optical signals transmitted by the dummy rows Ru1, Ru2, Ru3, Ru4, Rl1, Rl2, Rl3, and Rl4 start to be sensed, positions of the alignment mark 100 and the real row Rr may be detected. Also, since the pitches between the dummy alignment patterns 110u1, 110u2, 110u3, 110u4, 110l1, 110l2, 110l3, and 110l4 of the dummy rows Ru1, Ru2, Ru3, Ru4, Rl1, Rl2, Rl3, and Rl4 have a constant directionality, the position of the real row Rr may be easily estimated by observing changes in the signals transmitted by the dummy rows Ru1, Ru2, Ru3, Ru4, Rl1, Rl2, Rl3, and Rl4. This is because the pitch between the real alignment patterns 110r included in the real row Rr is predetermined or preset and a process operator already knows information on the real row Rr of the alignment mark 100 and the real alignment patterns 110r thereof.

In example embodiments of inventive concepts, all rows may be disposed at a constant interval. In example embodiments of inventive concepts, it is exemplarily illustrated for brevity that the alignment mark 100 has a vertically symmetrical shape, but the shape of the alignment mark 100 is not limited to the vertically symmetrical shape, as will be described in more detail later.

According to example embodiments of inventive concepts, when an alignment mark includes two real rows, the real rows may be arranged in arbitrary upper and lower positions, respectively, such that a row is interposed between the two real rows. In example embodiments of inventive concepts, the interposed row in which alignment patterns are arranged at the smallest pitch may be a dummy row, and one of upper rows and one of lower rows may be real rows. Real alignment patterns included in the real rows may be formed at the same pitch.

In example embodiments of inventive concepts, a pitch P, a space S, and a width W may be variously determined in consideration of light wavelength, a position of a photodiode, and the accuracy of an alignment process. Accordingly, defining specific numerical values of the pitch P, the space S, and the width W would be insignificant. Therefore, the present specification does not provide specific numerical values. However, experiments using an alignment marks according to example embodiments of inventive concepts were conducted under the condition where the alignment patterns included in the real row had a width W of about 1 μm, a space S of about 1 μm, and a pitch P of about 2 μm, and the space S or the pitch P was increased higher than adjacent rows by about 0.25 μm.

Figure 2A:
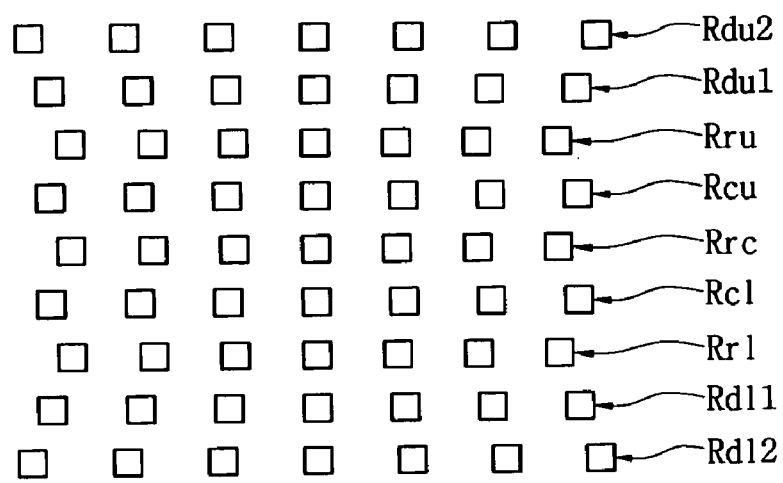
FIGS. 2A and 2B are plan views of alignment marks according to example embodiments of inventive concepts.
Figure 2B:
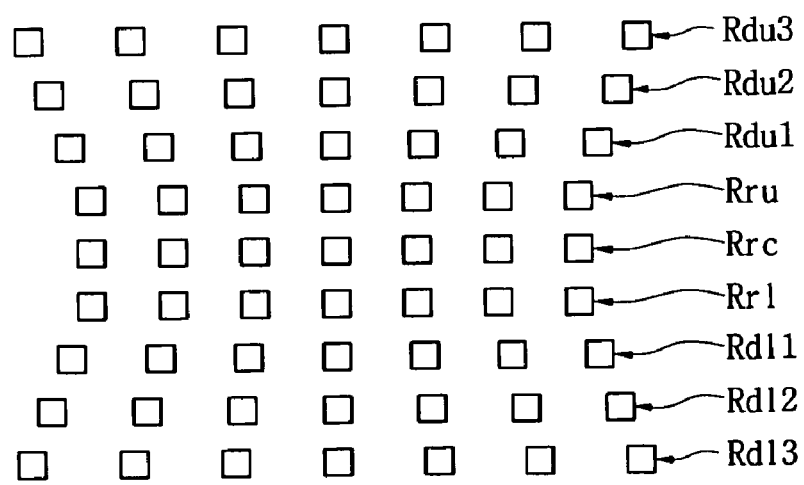

FIGS. 2A and 2B are plan views of alignment marks according to example embodiments of inventive concepts. Referring to FIG. 2A, an alignment mark 200a according to example embodiments of inventive concepts may include a plurality of real rows Rrl, Rrc, and Rru. For example, FIG. 2A illustrates the alignment mark 200a including the three real rows Rrl, Rrc, Rru. Inter-row dummy rows Rcu and Rcl may be respectively formed between adjacent ones of the real rows Rrl, Rrc, and Rru. Dummy rows Rd11, Rd12, Rcl, Rcu, Rdu1, and Rdu2 may be disposed above and below the real rows Rrl, Rrc, and Rru such that alignment patterns of the dummy rows Rd11, Rd12, Rcl, Rcu, Rdu1, and Rdu2 are arranged at greater pitches than pitches between alignment patterns of the real rows Rrl, Rrc, and Rru. According to example embodiments of inventive concepts, the alignment mark 200a may include a greater number of real rows than the three real rows Rrl, Rrc, and Rru.

Referring to FIG. 2B, an alignment mark 200b according to example embodiments of inventive concepts may include a plurality of real rows Rrl, Rrc, and Rru between which no dummy rows are provided. In other words, dummy rows Rd11, Rd12, Rd13, Rdu1, Rdu2, and Rdu3 may be formed only above and below the plurality of real rows Rrl, Rrc, and Rru. Alignment patterns of the dummy rows Rd11, Rd12, Rd13, Rdu1, Rdu2, and Rdu3 may be formed at greater pitches than pitches between alignment patterns of the real rows Rrl, Rrc, and Rru.

FIGS. 2A and 2B exemplarily illustrate that a pitch between alignment patterns of real rows is smaller than a pitch between alignment patterns of dummy rows. However, the pitch between the alignment patterns of the real rows may not be smaller than the pitch between the alignment patterns of the dummy rows.

Figure 3A:
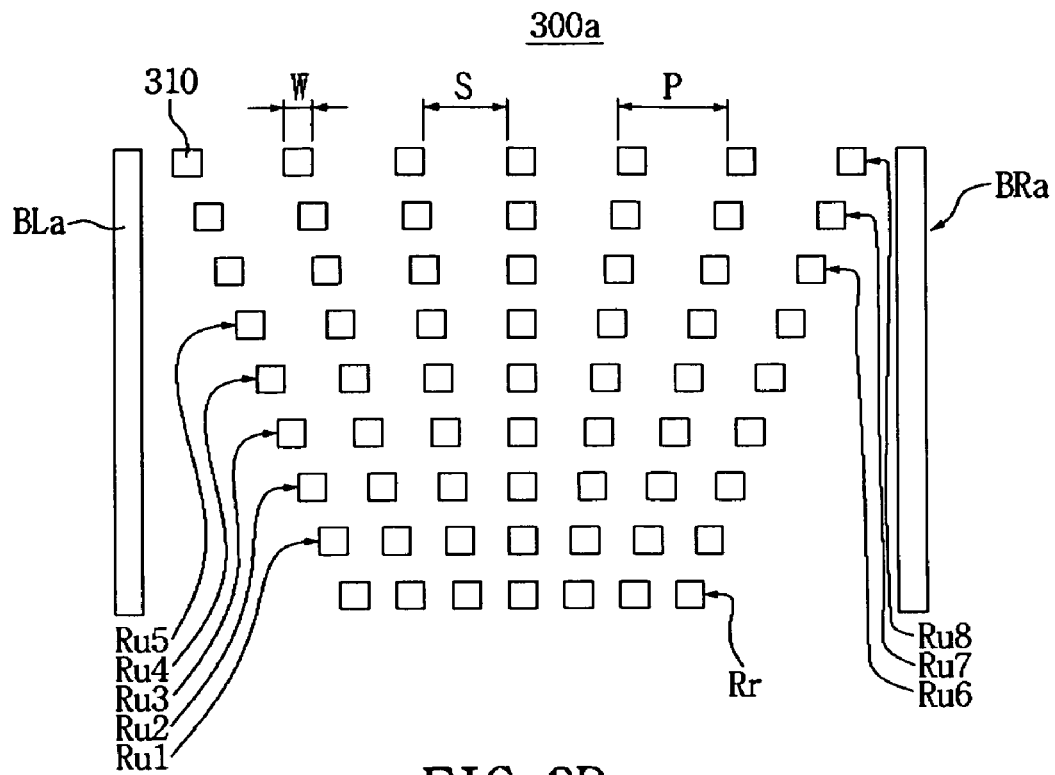
FIGS. 3A and 3B are plan views of alignment marks according to example embodiments of inventive concepts.
Figure 3B:
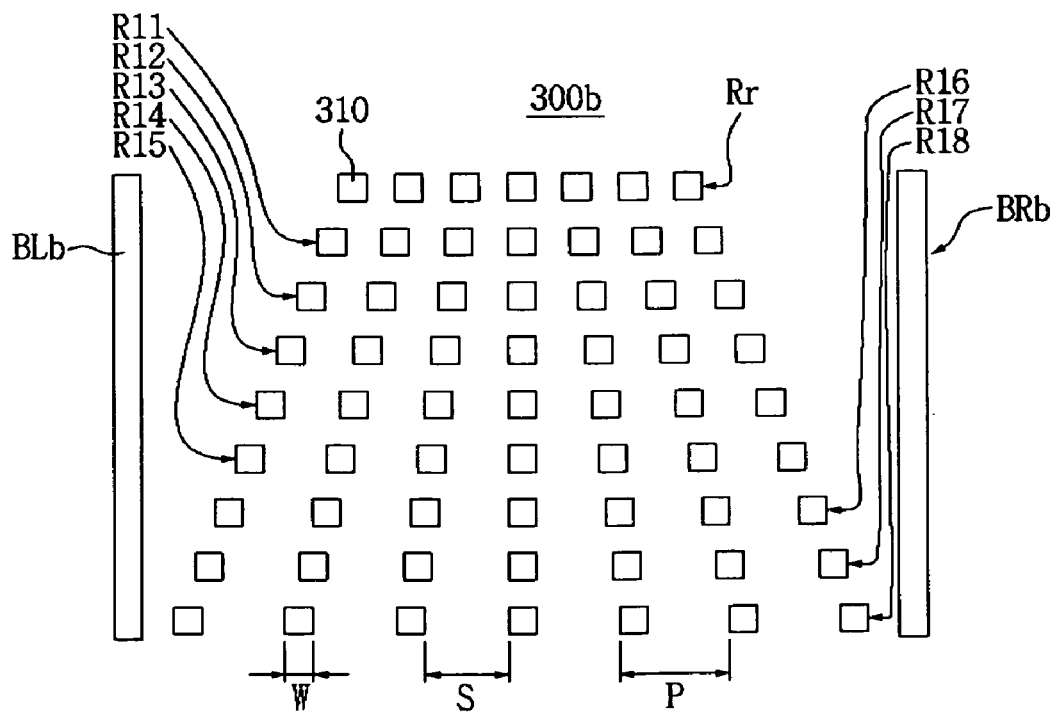

FIGS. 3A and 3B are plan views of alignment marks according to example embodiments of inventive concepts. Referring to FIGS. 3A and 3B, each of alignment marks 300a and 300b according to example embodiments of inventive concepts may include a plurality of alignment patterns 310 arranged in a plurality of rows and a plurality of columns. Bars BLa and BRa (or BLb and BRb) may be vertically formed in a column direction on both sides of the alignment patterns 310. The alignment patterns 310 included in each of rows may be arranged at the same pitch in a row direction, and alignment patterns 310 included in two adjacent rows may be arranged at different pitches. A description of the same components as in FIG. 1 will be omitted for brevity.

In example embodiments of inventive concepts, a real row may be disposed in the center of each of the alignment marks 300a and 300b or in an arbitrary position thereof. FIG. 1 illustrates and describes that the pitch between the real alignment patterns 110r included in the real row Rr is smaller than the pitches between the dummy alignment patterns 110u1, 110u2, 110u3, 110u4, 110l1, 110l2, 110l3, and 110l4. However, example embodiments of inventive concepts illustrate and describe that a pitch between dummy alignment patterns may be smaller than a pitch between real alignment patterns. In other words, the pitch between the real alignment patterns and the pitch between the dummy alignment patterns may differ from each other and have arbitrary numerical values.

In example embodiments of inventive concepts, the bars BLa and BRa (or BLb and BRb) formed vertically in the column direction of the alignment patterns may be used to prevent or retard the alignment patterns from being damaged during a CMP process. The bars BLa and BRa (or BLb and BRb) may be formed in a direction diagonal to the alignment patterns.

According to example embodiments of inventive concepts illustrated in FIGS. 3A and 3B, the real row Rr may be disposed in an uppermost or lowermost position. That is, the pitch between the real alignment patterns in the real rows Rr may be smaller or greater than the pitch between the dummy alignment patterns Ru1, Ru2, Ru3, Ru4, Ru5, Ru6, Ru7, Rl1, Rl2, Rl3, Rl4, Rl5, Rl6, and Rl7.

In example embodiments of inventive concepts, the columns in which the alignment patterns 320 are arranged may be arranged one-dimensionally. The one-dimensional arrangement may be regarded as a linear arrangement.

According to example embodiments of inventive concepts, each of the alignment marks 300a and 300b may include a single real row Rr and a plurality of dummy rows.

During a photolithography process using a scanner, an alignment process may involve sensing and analyzing light reflected and diffracted by an alignment mark to accurately align a wafer. A photodiode, which senses light reflected and diffracted by the alignment mark, may be fixed in a specific position of the scanner. When light irradiated to the alignment mark to perform the alignment process is reflected and diffracted at a respectively different angle according to the pitch between alignment patterns, light reflected and diffracted by alignment patterns (e.g., real alignment patterns) may be sensed by the photodiode in the specific position of the scanner. When alignment patterns in respective rows are arranged at intervals, the alignment patterns may function as a slit. That is, light reflected and diffracted by the alignment patterns may create diffraction and interference phenomena that depend on the wavelength of the light. Accordingly, because the alignment patterns are arranged at different pitches, light reflected and diffracted by the respective rows may have different diffraction angles. Therefore, when the photodiode is installed in a position where light reflected and diffracted by the real row is sensed to the highest degree, a precise alignment process may be performed. Because a phenomenon that light causes diffraction and interference while passing through an obstacle, such as a slit, is well known, a further description thereof will be omitted.

Hereinafter, a process of aligning a wafer using an alignment mark according to example embodiments of inventive concepts will be described with reference to FIGS. 4A through 4E.

Figure 4A:
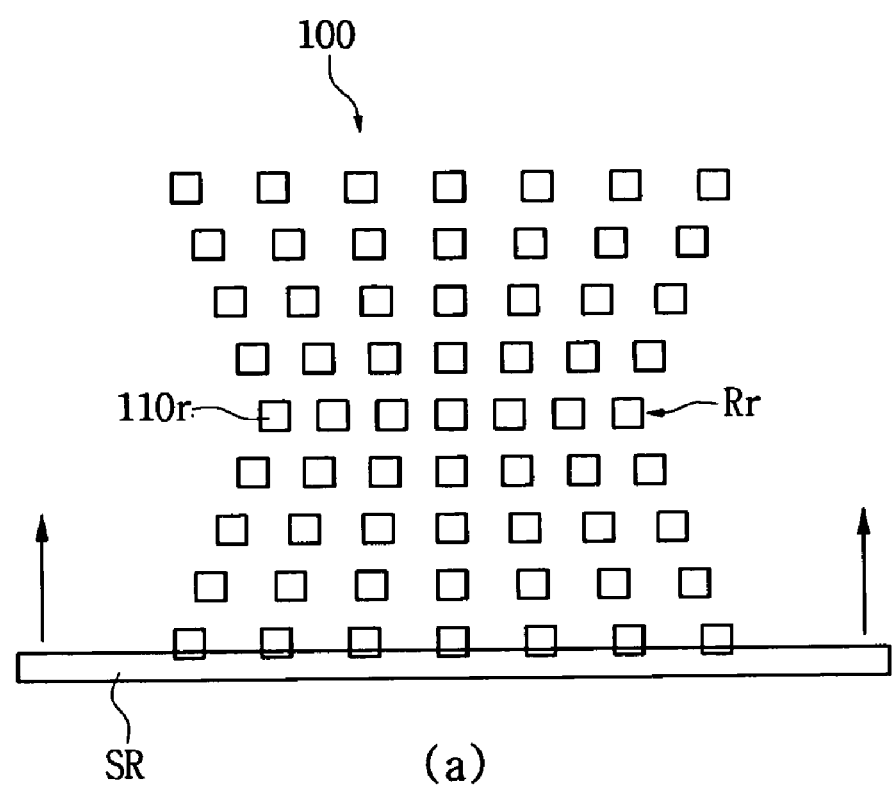
FIGS. 4A through 4E are diagrams illustrating a process of aligning a wafer using an alignment mark according to example embodiments of inventive concepts.
Figure 4A:
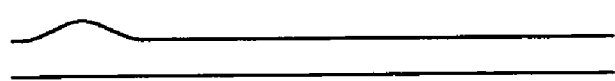

Referring to (a) of FIG. 4A, an irradiation region SR defined by an irradiation slit of a scanner may move upward from below the alignment mark 100. Specifically, the irradiation region SR of the alignment mark 100 starts to be irradiated by light. The irradiation slit may irradiate light to the irradiation region SR in order to perform an alignment process. The size of the irradiation region SR may be controlled according to the characteristics of a photolithography process. FIGS. 4A through 4E exemplarily illustrate that the irradiation region SR according to example embodiments of inventive concepts is controlled to irradiate light to only one row. The irradiation region SR may be formed to a smaller size to irradiate only a portion of one row or formed to a larger size to irradiate a plurality of rows. The size of the irradiation region SR may be variously controlled according to a process operator's intention to perform a photolithography process. An example of alignment information that may be obtained using the alignment mark 100 during the process shown in (a) of FIG. 4A is illustrated in (b) of FIG. 4A. Specifically, a very weak signal is sensed from the corresponding row.

Figure 4B:
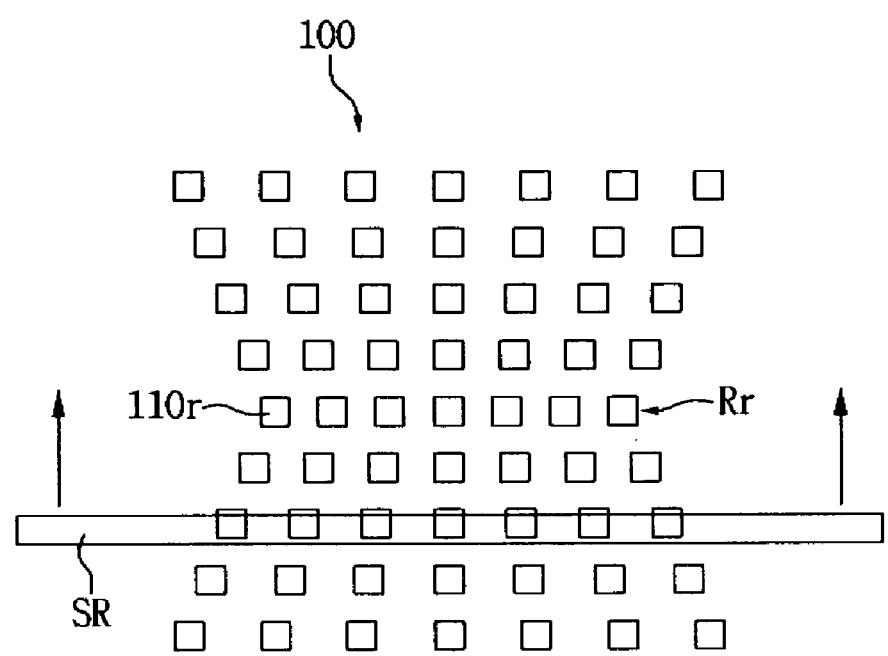
Figure 4B:
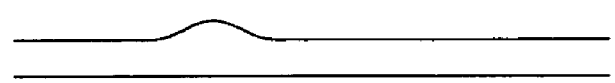

Referring to (a) and (b) of FIG. 4B, the irradiation region SR passes through the lower dummy rows to approach a real row from below. Thus, a similar signal is sensed in (b) of FIG. 3B to (b) of FIG. 3A.

Figure 4C:
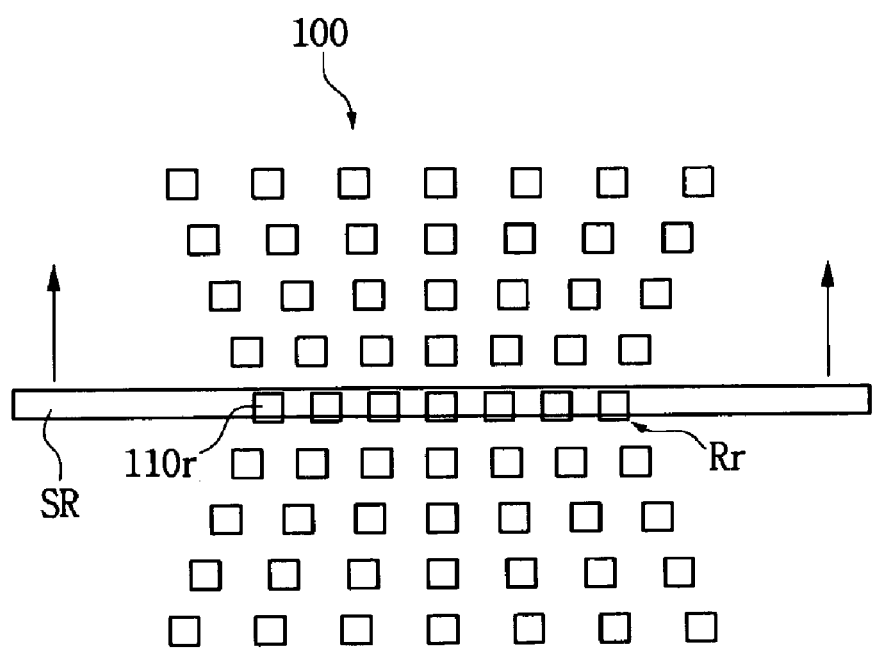
Figure 4C:
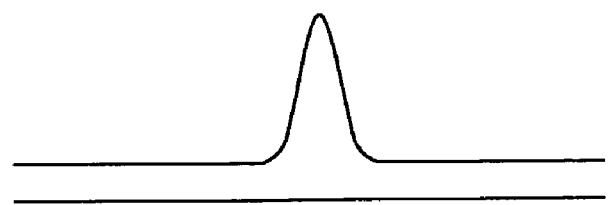

Referring to (a) and (b) of FIG. 4C, the irradiation region SR passes through a real row Rr. Thus, a signal transmitted by real alignment patterns 110r of the real row Rr is sensed high intensely. A signal, which is to be sensed when a wafer is located in an optimum position, may be already converted into data and input to a scanner. An alignment apparatus included in the scanner may compare the sensed signal with input alignment data and move a stage or chuck to an optimum position to align the wafer.

Figure 4D:
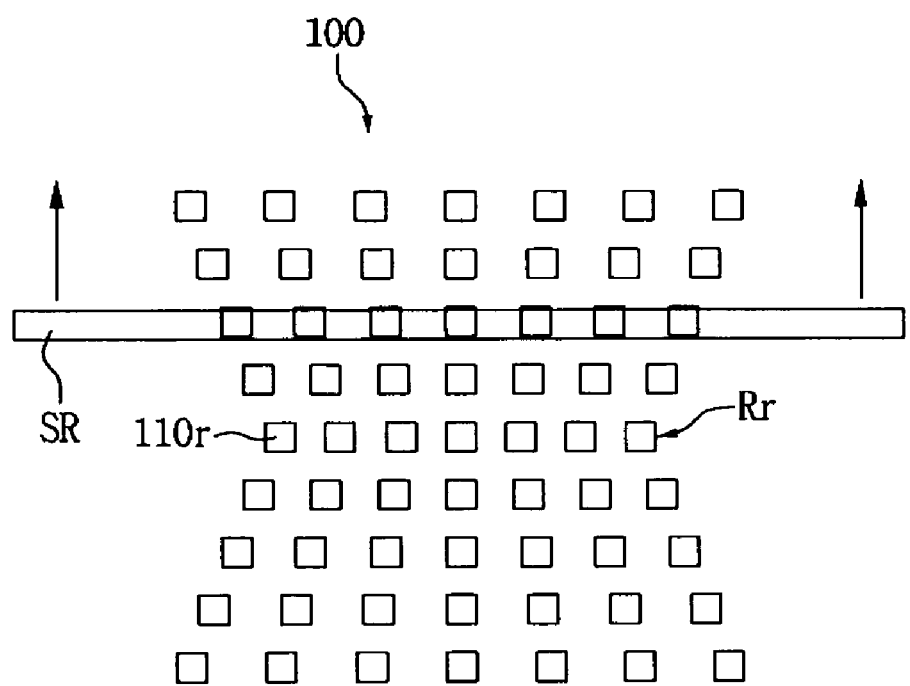
Figure 4D:
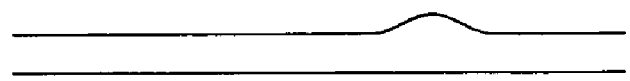

Referring to (a) and (b) of FIG. 4D, the irradiation region SR passes through one of upper dummy rows and becomes far away from the real row Rr. Thus, a signal sensed from a real row becomes weak like in FIG. 4A or 4B.

Figure 4E:
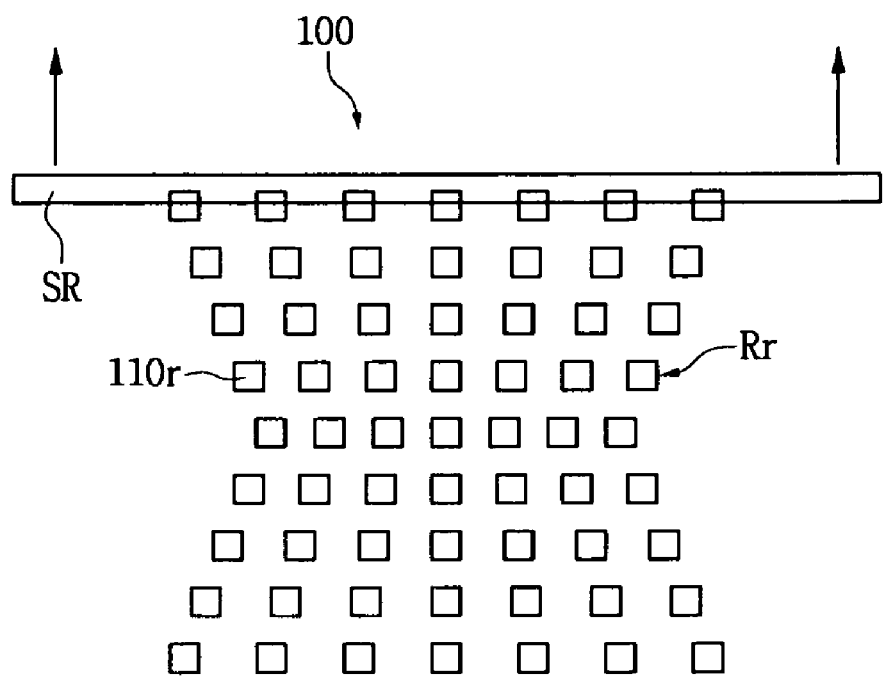
Figure 4E:
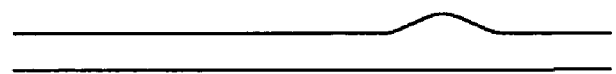

Referring to (a) and (b) of FIG. 4E, the irradiation region SR may pass through the uppermost dummy row disposed at the top of the alignment mark 100 so that the signal may be still very weak.

Figure 5A:
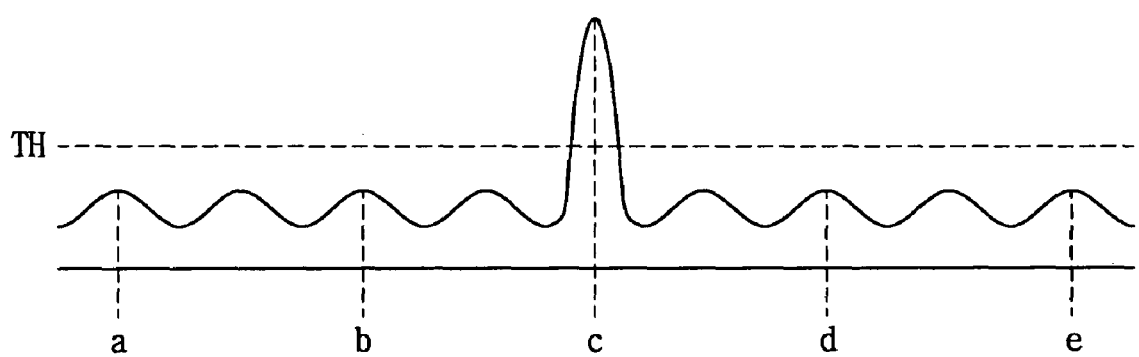
FIGS. 5A and 5B are graphs showing superposition of sensed signals on a single display during an alignment process using alignment marks according to example embodiments of inventive concepts.
Figure 5B:
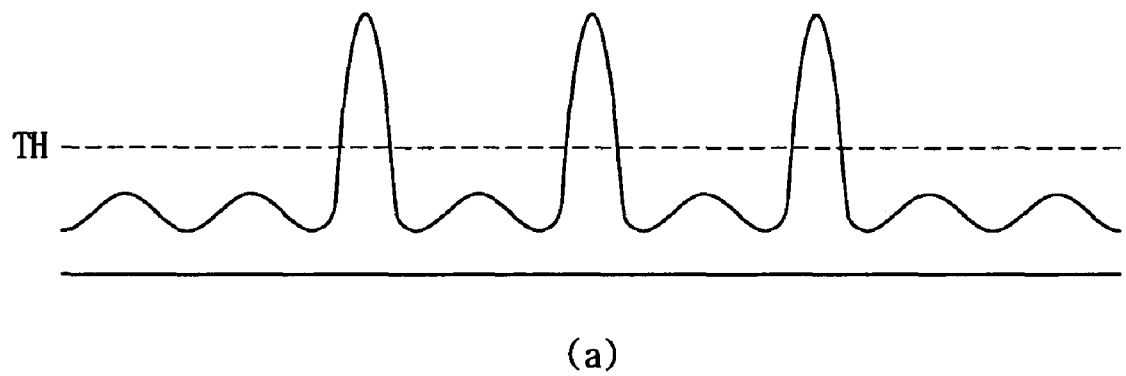
Figure 5B:
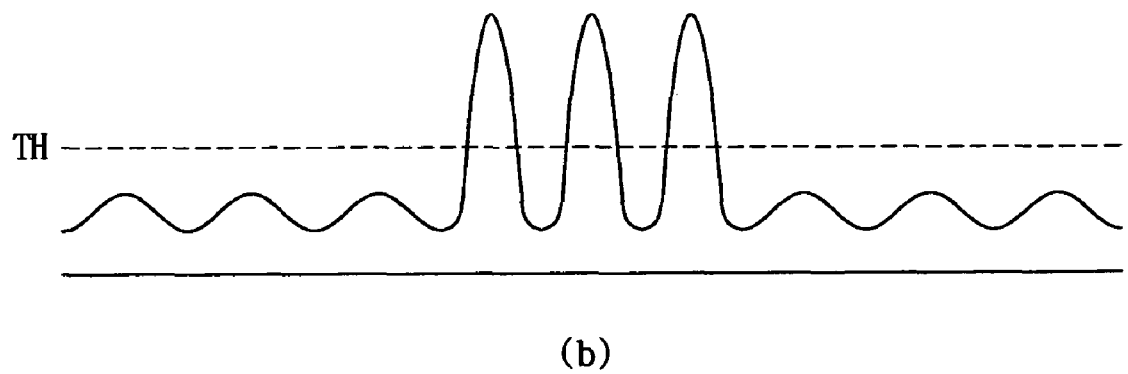

FIGS. 5A and 5B are graphs showing superposition of sensed signals on a single display during an alignment process using alignment marks according to example embodiments of inventive concepts.

Referring to FIG. 5A, signals "a", "b", "d" and "e" received during the processes shown in FIGS. 4A, 4B, 4D and 4E exhibit lower amplitudes, and a signal "c" received during the process shown in FIG. 4C exhibits a higher amplitude. In example embodiments of inventive concepts, by applying a threshold value TH at which only alignment information generated in a real row may be picked up, an accurate alignment process may be performed.

Referring to FIG. 5B, graphs showing superposition of signals, which are sensed during an alignment process using alignment marks according to example embodiments of inventive concepts, on a single display, it can be seen that signals having the same number of high peaks as the number of real rows are sensed. When the alignment process is performed using the alignment marks of FIGS. 2A and 2B, signals having the same number of high peaks as the number of the real rows may be displayed.

In FIGS. 5A and 5B, a signal sensed from dummy rows may not be displayed. This is because when a threshold value TH is applied beforehand, the signal sensed from the dummy rows may be zero (0). Because the threshold value TH is applied during an actual process, signals may not be displayed in the same manner as in FIGS. 5A and 5B. FIGS. 5A and 5B show the signals sensed from the dummy rows only to facilitate the understanding of the inventive concepts.

FIGS. 6A through 6D illustrate methods of fabricating a semiconductor device using the alignment marks according to example embodiments of inventive concepts and a process of aligning a wafer using the alignment marks. Referring the FIG. 6A, a wafer W is loaded onto a wafer stage 460 of a photolithography apparatus 400. The photolithography apparatus 400 may include a light source 410, a photomask 420, a projection lens 430, an irradiation slit 440, a detector 450, and the wafer stage 460. The wafer W may include an alignment mark M according to example embodiments of inventive concepts.

Figure 6A:
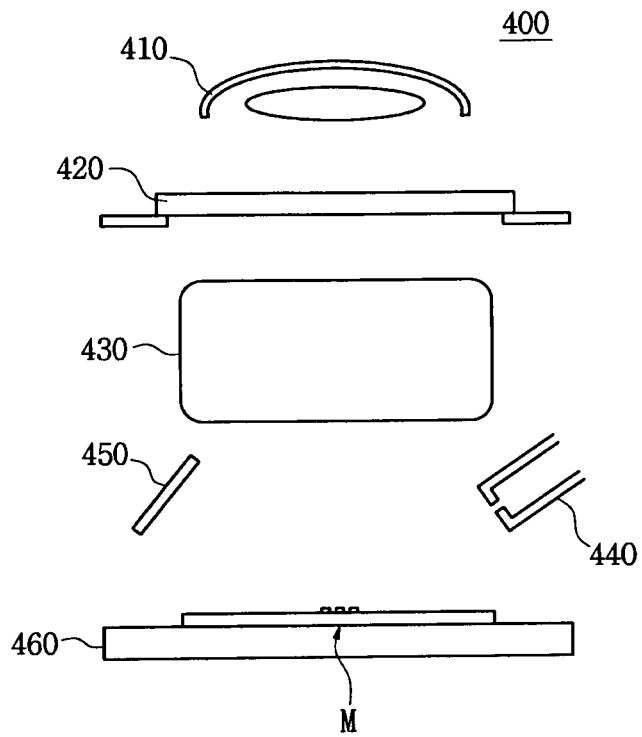
FIGS. 6A through 6D illustrate methods of fabricating a semiconductor device using the alignment marks and the process of aligning a wafer using the alignment marks of inventive concepts.
Figure 6B:
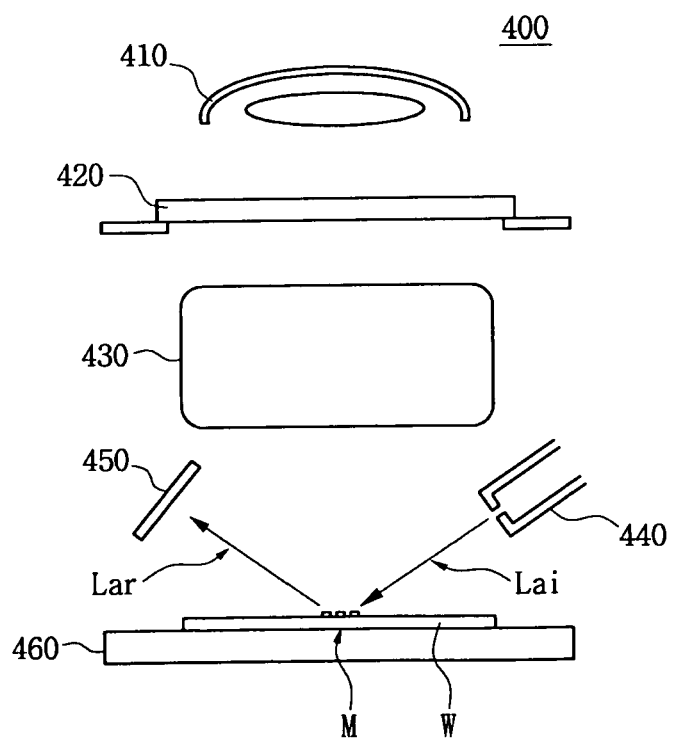

Referring to FIG. 6B, aligning light Lai is irradiated to the alignment mark M through the irradiation slit 440 with a scanning method. The reflected aligning light Lar from the alignment mark M is collected by the detector 450. The collected light of the detector 450 is analyzed in real time and location information of the wafer W may be displayed on a computer monitor. Accurate information of location and shapes of the alignment mark M may be stored in a computer. Thus, pieces of the information are compared with each other and the best location of the wafer W may be determined. For example, the best location is the stored location in the computer and the compared information may be tolerance ranges to be corrected.

Figure 6C:
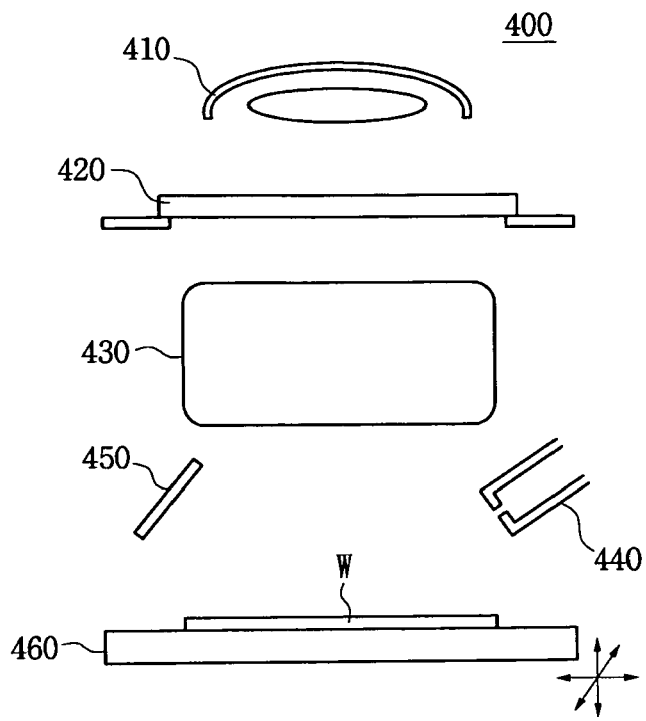

Referring to FIG. 6C, the wafer stage 460 may move up-down, front-rear, and/or left-right as indicated by the arrows to position the wafer W at the best location.

Figure 6D:
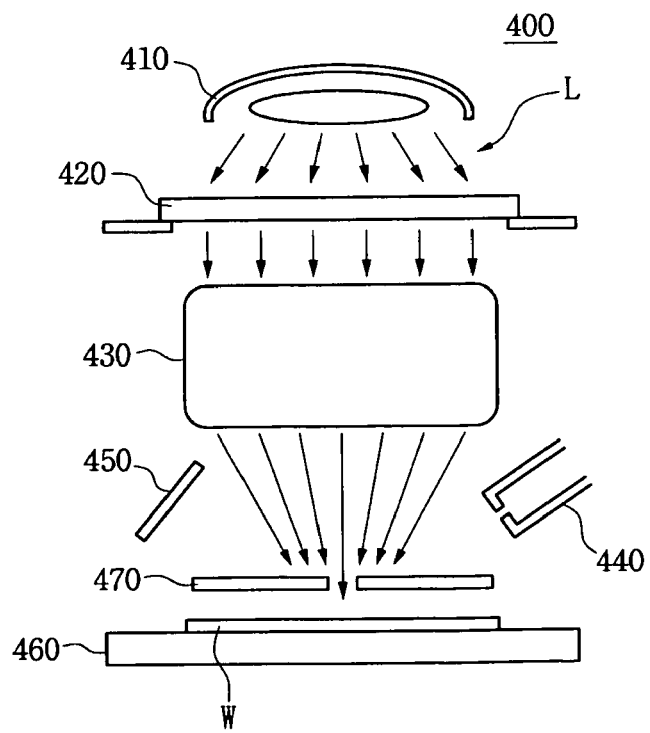

Referring to FIG. 6D, UV light L may be irradiated onto the wafer W through the photomask. In particular, optical patterns included in the photomask are projected onto the wafer W. A project slit 470 may be used in this irradiating process. In other words, the UV light L may be irradiated onto the wafer W through the project slit 470 with scanning methods.

Then, the wafer W may be processed in sequential processes such as a baking process, a developing process, and/or a cleaning process.

As described above, an alignment mark according to example embodiments of inventive concepts may generate precise alignment information even if the alignment mark is partially damaged due to a CMP process.

The foregoing is illustrative of example embodiments of inventive concepts and is not to be construed as limiting thereof. Although example embodiments of inventive concepts have been described, those skilled in the art will readily appreciate that many modifications are possible in example embodiments of inventive concepts without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments of inventive concepts and is not to be construed as limited to the specific embodiments disclosed, and that modifications to the disclosed embodiments, as well as other embodiments, are intended to be included within the scope of the appended claims.

What is claimed is:

1. An alignment method of a wafer, comprising:
providing a wafer on a wafer stage of a photolithography apparatus;
irradiating light to an alignment mark;
collecting reflected light from the alignment mark;
analyzing optical information of the collected light; and
determining a location of the wafer based on the analyzed optical information, wherein the wafer includes a first surface having the alignment mark, the alignment mark including
a first plurality of alignment patterns in a first row,
a second plurality of alignment patterns in a second row, the second plurality of alignment patterns being adjacent to the first plurality of alignment patterns, the first plurality of alignment patterns being arranged in a row direction at a first pitch, and the second plurality of alignment patterns being arranged in the row direction at a second pitch different from the first pitch.

2. The alignment method of claim 1, wherein each of the alignment patterns has one of a rectangular mesa and trench shape.

3. The alignment method of claim 1, wherein the alignment mark further includes a third plurality of alignment patterns arranged in a third row, wherein the second plurality of alignment patterns is on one side of the first row and the third plurality of alignment patterns is on another side of the first row.

4. The alignment method of claim 3, wherein the third plurality of alignment patterns are arranged at a third pitch different from the first pitch.

5. The alignment method of claim 4, wherein the second and third pitches are substantially the same.

6. The alignment method of claim 5, wherein the second and third pitches are greater than the first pitch.

7. The alignment method of claim 3, wherein the first plurality of alignment patterns is in a center of the alignment mark.

8. The alignment method of claim 3, wherein a distance between the rows is constant.

9. The alignment method of claim 3, wherein the third plurality of alignment patterns and the second plurality of alignment patterns are arranged symmetrically about the first row.

10. The alignment method of claim 9, wherein the second and third pitches are substantially the same and the second and third pitches are smaller than the first pitch.

11. The alignment method of claim 3, wherein the third plurality of alignment patterns are arranged at a third pitch different from the second pitch.

12. The alignment method of claim 11, wherein the first pitch and the third pitch are substantially the same.

13. The alignment method of claim 3, wherein the third plurality of alignment patterns in the third row are arranged at a third pitch, and the third pitch is greater than the first pitch and the first pitch is greater than the second pitch.

14. The alignment method of claim 1, wherein the alignment mark further includes
a third plurality of alignment patterns arranged in a third row, the third plurality of alignment patterns being adjacent to the first plurality of alignment patterns in the first row and being arranged in the row direction at a third pitch, and
a fourth plurality of alignment patterns arranged in a fourth row, the fourth plurality of alignment patterns being adjacent to the third plurality of alignment patterns, the fourth plurality of alignment patterns being arranged in the row direction at a fourth pitch, the first and third pitches being substantially the same and the second and fourth pitches being substantially the same.

15. The alignment method of claim 14, wherein a distance between the rows is constant.

16. The alignment method of claim 1, wherein
the first row is a real row having alignment information of a wafer, and
the second row is a dummy row not having alignment information of the wafer.

17. The alignment method of claim 16, wherein
the first pitch is a real pitch having alignment information of the wafer, and
the second pitch is a dummy pitch not having alignment information of the wafer.

18. The alignment method of claim 1, wherein the light is irradiated onto the wafer through an irradiation slit extending in the row direction of the alignment mark and the irradiation slit is moved in a column direction of the alignment mark.

19. A method of fabricating a semiconductor device, comprising:
loading a wafer onto a wafer stage of a photolithography apparatus;
irradiating light to an alignment mark through an irradiation slit of the photolithography apparatus;
collecting reflected light from the alignment mark;
analyzing optical information of the collected light;
determining a location of the wafer based on the analyzed optical information;
moving the wafer to a desired location based on the determined location; and
irradiating UV light from a light source of the photolithography apparatus to the wafer, wherein the wafer includes a first surface having the alignment mark, the alignment mark including
a first plurality of alignment patterns in a first row,
a second plurality of alignment patterns in a second row, the second plurality of alignment patterns being adjacent to the first plurality of alignment patterns, the first plurality of alignment patterns being arranged in a row direction at a first pitch, and the second plurality of alignment patterns being arranged in the row direction at a second pitch different from the first pitch.

* * * * *